(12) United States Patent
Yang et al.

(10) Patent No.: US 9,147,805 B2
(45) Date of Patent: Sep. 29, 2015

(54) SEMICONDUCTOR DEVICE HAVING TRENCH AND FABRICATION METHOD THEREOF

(71) Applicant: National Taiwan University, Taipei (TW)

(72) Inventors: Chih-Chung Yang, Taipei (TW); Chun-Han Lin, Taipei (TW); Chia-Ying Su, Taipei (TW); Horng-Shyang Chen, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 14/093,056

(22) Filed: Nov. 29, 2013

(65) Prior Publication Data

US 2015/0097209 A1  Apr. 9, 2015

(30) Foreign Application Priority Data

Oct. 3, 2013  (TW) .............................. 102135879 U

(51) Int. Cl.
*H01L 33/20* (2010.01)
*H01L 33/12* (2010.01)
*H01L 33/32* (2010.01)

(52) U.S. Cl.
CPC ................ *H01L 33/20* (2013.01); *H01L 33/12* (2013.01); *H01L 33/32* (2013.01)

(58) Field of Classification Search
CPC .......... H01L 33/20; H01L 33/12; H01L 33/32
USPC .................... 257/103, 98, E33.023, E33.005; 438/46, 47, 42
See application file for complete search history.

(56) References Cited

U.S. PATENT DOCUMENTS

| 4,210,923 | A  | * | 7/1980 | North et al. ................... 257/432 |
| 6,703,253 | B2 | * | 3/2004 | Koide ............................. 438/28 |
| 7,122,847 | B2 | * | 10/2006 | Seo ................................. 257/98 |

(Continued)

FOREIGN PATENT DOCUMENTS

| TW | 201131837 | 9/2011 |
| TW | 201335972 | 9/2013 |

OTHER PUBLICATIONS

Shi-Bang Chang, Abstract of "Structural and optical properties of InGaN/GaN MQW grown on V-grooved (100)Si structure," National Central University Master's thesis, Jul. 3, 2006.

(Continued)

*Primary Examiner* — Sheng Zhu
(74) *Attorney, Agent, or Firm* — Jianq Chyun IP Office

(57) ABSTRACT

A semiconductor device including a Si (110) substrate, a buffer layer, a first type doped semiconductor layer, a light-emitting layer and a second type doped semiconductor layer is provided. The Si (110) substrate has a plurality of trenches. Each trench at least extends along a first direction, and the first direction is parallel to a <1-10> crystal direction of the Si (110) substrate. The buffer layer is located on the Si (110) substrate and exposes the trenches. The first type doped semiconductor layer is located on the buffer layer and covers the trenches. The light-emitting layer is located on the first type doped semiconductor layer. The second type doped semiconductor layer is located on the light-emitting layer. A fabrication method of a semiconductor device is also provided.

18 Claims, 8 Drawing Sheets

(56) References Cited

U.S. PATENT DOCUMENTS

| | | |
|---|---|---|
| 7,396,407 B2 * | 7/2008 | Saenger et al. ............... 117/63 |
| 8,368,183 B2 | 2/2013 | Yamada et al. |
| 8,425,681 B1 * | 4/2013 | Wang et al. .................. 117/96 |
| 8,426,919 B2 | 4/2013 | Wells et al. |
| 2005/0025204 A1 * | 2/2005 | Kamikawa et al. ........... 372/43 |
| 2008/0220555 A1 * | 9/2008 | Saxler et al. ................. 438/47 |
| 2009/0298212 A1 * | 12/2009 | Pan ............................... 438/42 |

OTHER PUBLICATIONS

Chen et al, "Strain reduction and crystal improvement of an InGaN/GaN quantum-well light-emitting diode on patterned Si(110) substrate," Applied Physics Letters, Oct. 3, 2013, pp. 141-914, vol. 103.

Balakrishnan et al., "Monolithically integrated III-Sb CW superluminal light emitting diodes on non-miscut Si(100) substrates," Electronics Letters, Feb. 15, 2007, pp. 244-245, vol. 43, Issue 4.

"Office Action of Taiwan Counterpart Application", issued on May 20, 2015, p. 1-6.

* cited by examiner

SEMICONDUCTOR DEVICE HAVING TRENCH AND FABRICATION METHOD THEREOF

CROSS-REFERENCE TO RELATED APPLICATION

This application claims the priority benefit of Taiwan application serial no. 102135879, filed on Oct. 3, 2013. The entirety of the above-mentioned patent application is hereby incorporated by reference herein and made a part of this specification.

BACKGROUND OF THE INVENTION

1. Field of the Invention

The invention relates to a semiconductor device and a fabrication method thereof.

2. Description of Related Art

With the progress in optoelectronic technologies, the fabrication and application of semiconductor devices have gradually matured. Devices such as optoelectronic devices and electronic devices can be fabricated with semiconductors, thus making the semiconductor industry a promising industry.

Generally speaking, the structure of a semiconductor device includes a substrate and at least one semiconductor layer disposed on the substrate. Considering the properties of lower cost, larger wafer size, higher thermal and electrical conductivities and the potential for integrating with electrical circuits, silicon substrates have been considered as one type of substrates for fabricating semiconductor light-emitting devices, and silicon (111) substrates are the most common type.

However, since the thermal expansion coefficient of the silicon substrate is lower than the thermal expansion coefficient of the gallium nitride semiconductor layer for fabricating the light-emitting device, there is a tensile stress generated in the nitride semiconductor layer during the temperature-dropping process after film-forming. The tensile stress drags the lattice structure of the nitride semiconductor layer, resulting in cracks of the nitride semiconductor layer. In addition, due to lattice mismatch between the nitride semiconductor layer and the silicon substrate, the nitride semiconductor layer grown on the silicon substrate tends to have a high density of threading dislocations. The phenomena described above influence the characteristics of the nitride semiconductor device. Therefore, issues such as reducing cracks and threading dislocations are certainly the issues that researchers nowadays need to work on.

SUMMARY OF THE INVENTION

The invention provides a fabrication method of a semiconductor device. The semiconductor device fabricated according to the fabrication method has a preferable characteristic.

The invention provides a semiconductor device having a preferable characteristic.

The fabrication method of the semiconductor device of the invention includes the following. A silicon (110) substrate is provided. In addition, there are a plurality of trenches formed on the silicon (110) substrate. Each of the trenches at least extends along a first direction, and the first direction is parallel to a <1-10> crystal direction of the silicon (110) substrate. A buffer layer is formed on the silicon (110) substrate, and the buffer layer exposes the trenches. A first type doped semiconductor layer is formed on the buffer layer, and the first type doped semiconductor layer covers the trenches. A light-emitting layer is formed on the first type doped semiconductor layer. A second type doped semiconductor layer is formed on the light-emitting layer.

The semiconductor device of the invention includes a silicon (110) substrate, a buffer layer, a first type doped semiconductor layer, a light-emitting layer, and a second type doped semiconductor layer. The silicon (110) substrate has a plurality of trenches. Each of the trenches at least extends along a first direction, and the first direction is parallel to a <1-10> crystal direction of the silicon (110) substrate. The buffer layer is located on the silicon (110) substrate and exposes the trenches. The first type doped semiconductor layer is located on the buffer layer and covers the trenches. The light-emitting layer is located on the first type doped semiconductor layer. The second type doped semiconductor layer is located on the light-emitting layer.

In view of the foregoing, the substrate of the semiconductor device of the invention uses the silicon (110) substrate and takes advantages of the anisotropic lattice size and the anisotropic thermal expansion efficient of the silicon substrate (110) to design the trenches. The cracks are reduced by reducing the contact area between the silicon (110) substrate and the semiconductor layer. In addition, an anisotropy of the lattice size of the semiconductor layer and a lateral growth mechanism on the trenches are used to reduce threading dislocations. Also, when the semiconductor device serves as a semiconductor light-emitting device, the light extraction efficiency is improved by disposing of the trenches. Therefore, the semiconductor device of the invention has a preferable characteristic.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
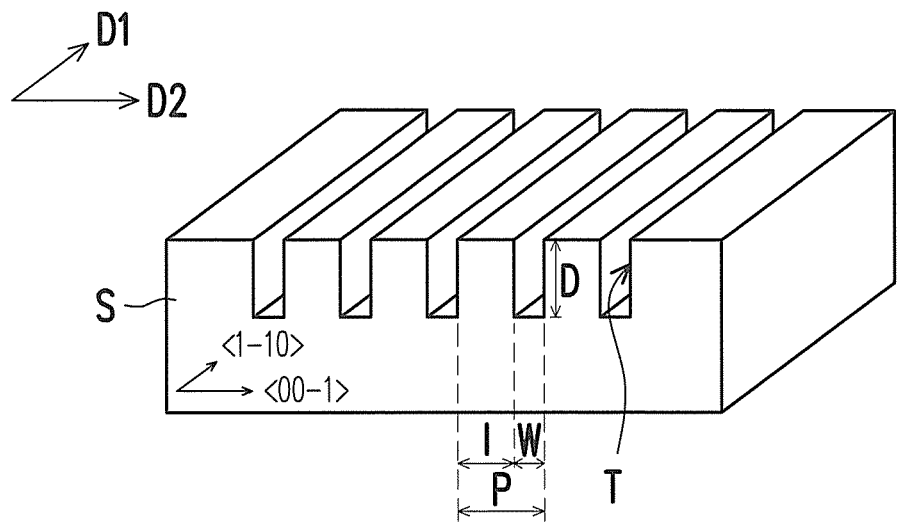
FIGS. 1A to 1F are schematic views showing a fabrication process of a semiconductor device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1F are schematic views showing a fabrication process of a semiconductor device according to an embodiment of the invention. Referring to FIG. 1A, a silicon (110) substrate S is provided. In addition, there are a plurality of trenches T formed on the silicon (110) substrate S. Each of the trenches T at least extends along a first direction D1 parallel to a <1-10> crystal direction of the silicon substrate S. Namely, the first direction D1 is an a-axis direction of a crystal.

In this embodiment, each of the trenches T is, for example, a striped trench, but the invention is not limited thereto. The trenches T are, for example, arranged along a second direction D2 parallel to a <00-1> crystal direction of the silicon (110) substrate S. Namely, the second direction D2 is in an m-axis direction of the crystal. It should be noted that the trenches in the invention are not limited to the aspects of embodiment described above. In other embodiments, in addition to extending along the first direction D1, the trenches may also simultaneously extend along another direction, thereby forming a two-dimensional trench structure. However, a trench structure should be designed in accordance with the design requirement, and the examples described herein are not intended to be exhaustive.

An arrangement period P of the trenches T falls within a range between 100 nanometers and 100 micrometers, for example. A width W of each of the trenches T falls within a range between 50 nanometers and 50 micrometers, for example. A depth D of each of the trenches T falls within a range between 100 nanometers and 50 micrometers, for example. In this embodiment, the depth D of the trenches T is approximately 25 micrometers, for example, and the arrangement period P of the trenches T is 16 micrometers, for example. The width W of each of the trenches T is 6 micrometers, for example, and an interval I between two adjacent of the trenches T is 10 micrometers, for example.

Figure 1B:
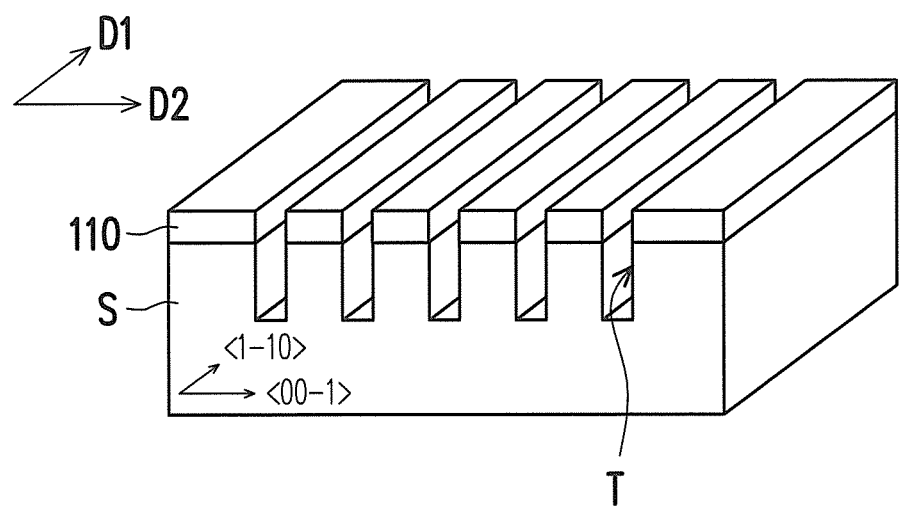

Referring to FIG. 1B, a buffer layer 110 is formed on the silicon (110) substrate S, and the buffer layer 110 exposes the trenches T. The buffer layer 110 is disposed to reduce an influence of thermal stress on a quality of subsequent epitaxy, for example. A material of the buffer layer 110 may be metal nitrides. For example, the material of the buffer layer 110 may be aluminum nitride or aluminum gallium nitride or a combination thereof. In this embodiment, the material of the buffer layer 110 may be aluminum nitride, for example.

In addition, a film-forming method of the buffer layer 110 includes a metal organic chemical vapor deposition (MOCVD) process, for example. However, the embodiment is not limited thereto. In other embodiments, the film-forming method of the buffer layer 110 may also be methods like a molecular beam epitaxy (MBE) process, a sputtering process, an evaporation process, a pulsed laser deposition (PLD) process, a vapor phase epitaxy (VPE) process, a liquid phase epitaxy (LPE) process, an atomic layer deposition (ALD) process, a chemical vapor deposition (CVD) process, etc.

The film-forming process of the buffer layer 110 includes, for example, forming a multiple-layer laminated structure of aluminum gallium nitride with varied aluminum concentration and growing aluminum nitride with a plurality of levels of temperature modulation. In this embodiment, the buffer layer is aluminum nitride grown with a plurality of levels of temperature modulation. A temperature at each of the levels ranges from 600° C. to 1200° C., and the temperatures of the levels include gradually drop. Specifically, by modulation of gradually lowering the temperatures during the film-forming process of the buffer layer, a compressive stress is generated in the buffer layer formed at each of the levels. In this way, a tensile stress generated in a semiconductor layer through the temperature-dropping process after the semiconductor layer is subsequently formed may be compensated, thereby producing a crack-free semiconductor device. In this embodiment, the film-forming process of the buffer layer 110 includes five levels of temperature modulation, for example. The temperature at each of the levels is sequentially 1100° C., 1000° C., 900° C., 800° C., and 700° C., and a thickness of growth at each of the levels is 72 nanometers, for example. Namely, a thickness H110 of the buffer layer 110 of this embodiment is 360 nanometers, for example. However, the invention is not limited thereto.

Figure 1C:
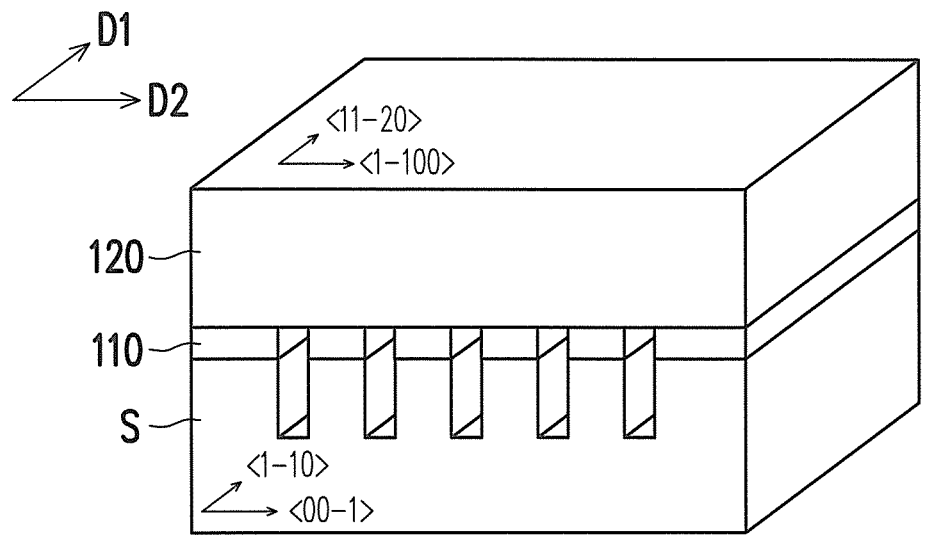

Referring to FIG. 1C, in this embodiment, a strain compensation stack layer 120 may be further formed on the buffer layer 110 before forming a first type doped semiconductor layer, so as to further provide the compressive stress. In this embodiment, the strain compensation stack layer 120 may include at least one aluminum nitride layer (not shown) and at least one gallium nitride layer (not shown). For example, the strain compensation stack layer 120 includes a plurality of aluminum nitride layers and a plurality of gallium nitride layers. In addition, the aluminum nitride layer and the gallium nitride layer are stacked alternately, and there is at least one of the gallium nitride layers located between at least one of the aluminum nitride layers and the buffer layer 120. Namely, the gallium nitride layer is firstly formed on and in contact with the buffer layer 120.

Generally speaking, since the gallium nitride layer and the silicon substrate have different thermal expansion coefficients and are mismatched in lattice, the gallium nitride layer grown on the silicon substrate is prone to crack and has a high density of threading dislocations. However, since the silicon (110) substrate S used in this embodiment is anisotropic in terms of stress and thermal expansion coefficient, the issue of cracks and threading dislocations may be effectively improved with design of the trenches T.

More specifically, the silicon (110) substrate S has the <1-10> crystal direction parallel to the a-axis (i.e. the first direction D1) and the <00-1> crystal direction parallel to the m-axis direction (i.e. the second direction D2), and the two crystal directions are perpendicular to each other. Besides, the gallium nitride layer also has a <11-20> crystal direction parallel to the a-axis and a <1-100> crystal direction parallel to the m-axis. When the gallium nitride layer are grown on the silicon (110) substrate S, the <11-20> crystal direction of the gallium nitride layer is matched with the <1-10> crystal direction of the silicon (110) substrate S, and the <1-100> crystal direction of the gallium nitride layer is matched with the <00-1> crystal direction of the silicon (110) substrate S. In addition, a lattice constant of the silicon (110) substrate S is higher than a lattice constant of the gallium nitride layer by approximately 17% in the first direction D1, whereas the lattice constant of the silicon (110) substrate S is lower than the lattice constant of the gallium nitride layer by approximately 1.65% in the second direction D2.

Regarding the stress, since the lattice constant of the gallium nitride layer on the m-axis (the second direction D2) and the lattice constant of the silicon (110) substrate S are very similar (approximately 1.65%), a density of threading dislocations along this crystal axis may be significantly reduced. Moreover, even though there is a greater difference (approximately 17%) in the lattice constant between the gallium nitride layer and the silicon (110) substrate S on the a-axis (the first direction D1), and a high density of threading dislocations are consequently generated, the threading dislocations are bent through a lateral growth during a lateral growing process along the m-axis on the trenches T. Therefore, a density of threading dislocations in a light-emitting layer on a top portion of the epitaxial layer may be significantly reduced, and a crystal quality is thus significantly improved. In this way, compared to a silicon (111) substrate that is commonly used nowadays, the gallium nitride layer formed on the silicon (110) substrate S of this embodiment has a relatively lower density of threading dislocations.

Furthermore, in terms of thermal expansion coefficients, the thermal expansion coefficient of the gallium nitride layer is higher than the thermal expansion coefficient of the silicon (110) substrate S, and a thermal expansion coefficient of the silicon (110) substrate S on the a-axis (i.e. the first direction D1) is higher than a thermal expansion coefficient of the silicon (110) substrate S on the m-axis (i.e. in the second direction D2). Namely, the thermal expansion coefficient of the silicon (110) substrate S on the m-axis (the second direction D2) has a greater difference from the thermal expansion coefficient of the gallium nitride layer. However, in this embodiment, a contact area between the silicon (110) substrate and the gallium nitride layer is reduced by disposing the trenches T, so the tensile stress generated through the temperature-dropping process after crystal growth is consequently reduced, thereby reducing cracks due to different thermal expansion coefficients.

Figure 1D:
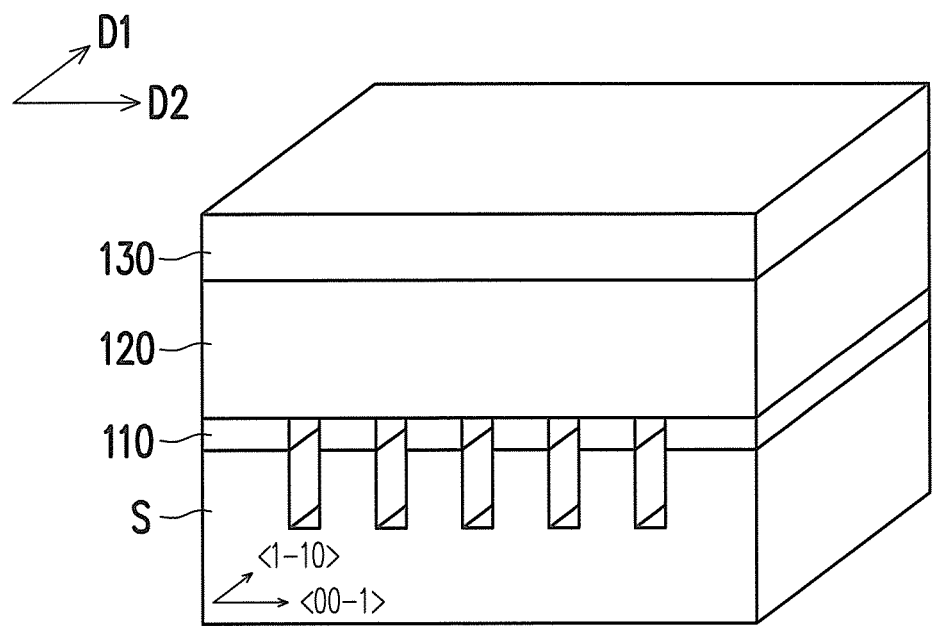

Referring to FIG. 1D, a first type doped semiconductor layer 130 is formed on the buffer layer 120. Since the buffer layer 120 already covers the trenches T before the first type doped semiconductor layer 130 is formed, the first type doped semiconductor layer 130 also covers the trenches T. A material of the first type doped semiconductor layer 130 includes gallium nitride, indium nitride, indium gallium nitride, aluminum gallium nitride, indium gallium aluminum nitride, or a combination thereof. In this embodiment, the first type doped semiconductor layer 130 is an N-type gallium nitride layer, for example.

In addition, a film-forming method of the first type doped semiconductor layer 130 includes a metal organic chemical vapor deposition (MOCVD) process, for example. However, the embodiment is not limited thereto. In other embodiments, the film-forming method of the first type doped semiconductor layer 130 may also be a molecular beam epitaxy (MBE) process, a sputtering process, an evaporation process, a pulsed laser deposition (PLD) process, a vapor phase epitaxy (VPE) process, a liquid phase epitaxy (LPE) process, an atomic layer deposition (ALD) process, a chemical vapor deposition (CVD) process, etc.

Figure 1E:
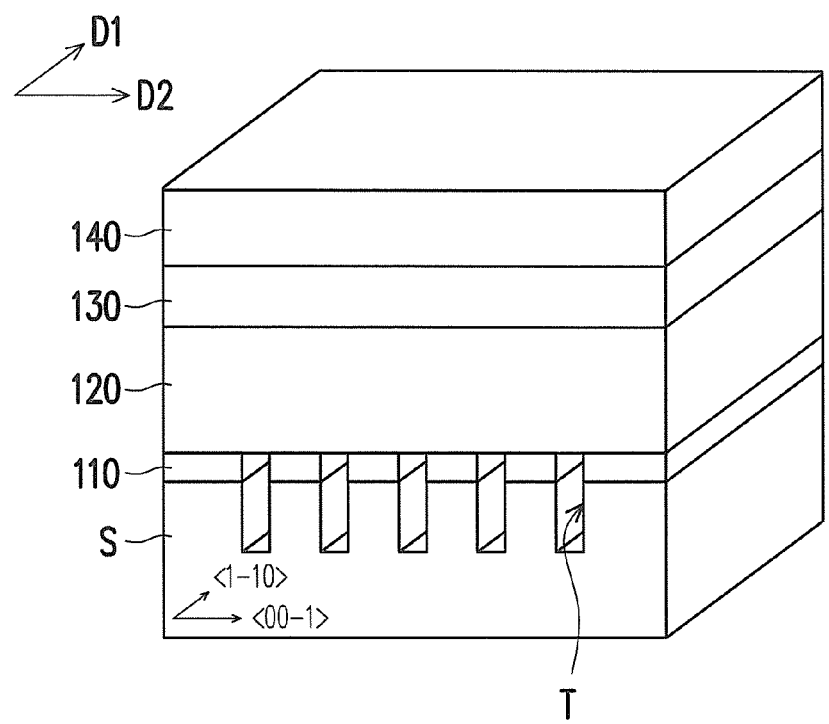

Referring to FIG. 1E, a light-emitting layer 140 is formed on the first type doped semiconductor layer 130. The light-emitting layer 140 is a quantum well layer or a multiple quantum well (MQW) layer, for example. In this embodiment, the light-emitting layer 140 is a multiple quantum well layer with a plurality of indium gallium nitride layers and a plurality of gallium nitride layers alternately stacked. However, the invention is not limited thereto. The film-forming method of the first type doped semiconductor layer 130 may be used for film-forming the light-emitting layer 140, so no further details in this respect are described hereinafter.

Figure 1F:
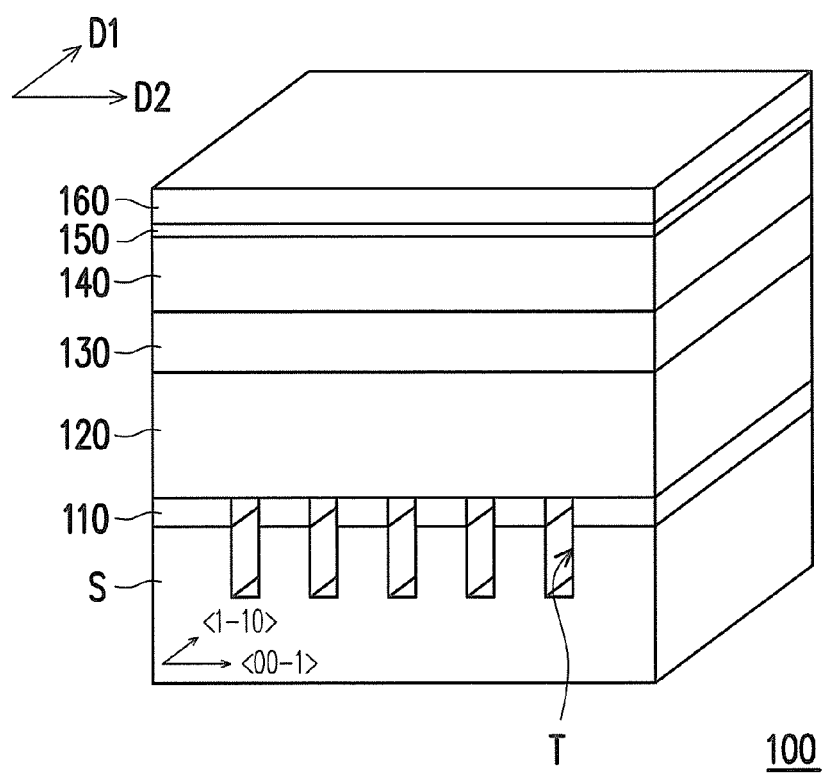

Referring to FIG. 1F, a second type doped semiconductor layer 160 is formed on the light-emitting layer 140. In this embodiment, an electron blocking layer 150 may be formed before the second type doped semiconductor layer 160 is formed. The electron blocking layer 150 is, for example, a P-type aluminum gallium nitride layer, but the invention is not limited thereto. The second type doped semiconductor layer 160 is, for example, a P-type gallium nitride layer, but the invention is not limited thereto. The film-forming method of the first type doped semiconductor layer 130 may also be used for film-forming of the electron blocking layer 150 and the second type doped semiconductor layer 160, so no further details in this respect are described hereinafter.

After the second type doped semiconductor layer 160 is formed, a semiconductor device 100 is preliminarily fabricated. People having ordinary skills in the art may design electrode layers according to the design requirement. Therefore, no further details in this respect are further described hereinafter. In this embodiment, the semiconductor device 100 may serve as a semiconductor light-emitting device, for example. With scattering of the trenches T, a chance that light emitted from the light-emitting layer 140 is transmitted toward the silicon (110) substrate S and absorbed by the silicon (110) substrate S is reduced. Therefore, a light extraction efficiency is thus improved.

Figure 2:
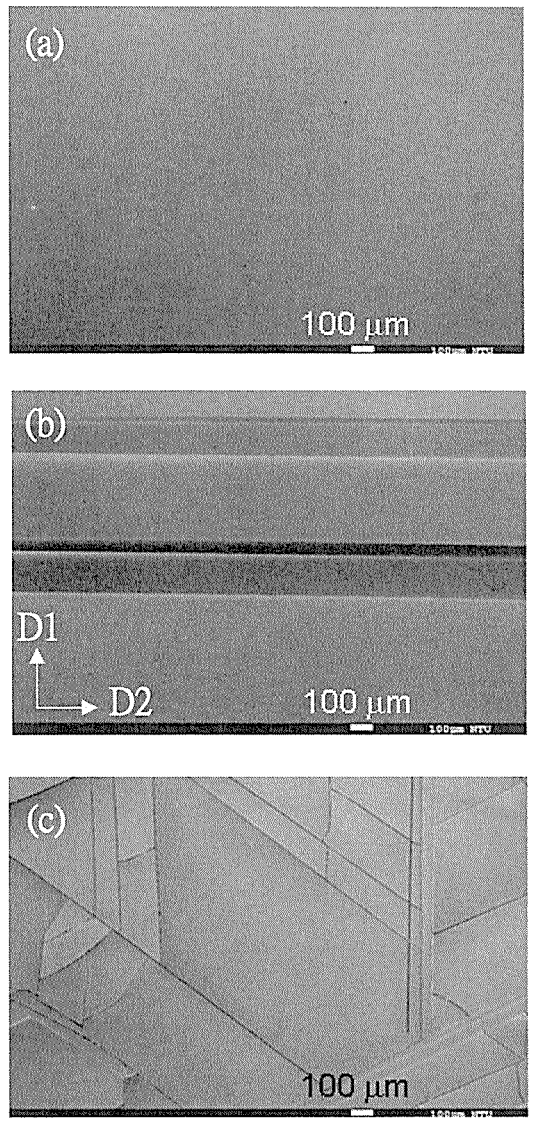
FIG. 2 shows the surface images of the second type doped semiconductor layers of an experimental example of the invention and comparative examples observed with a scanning electronic microscope.
Figure 3:
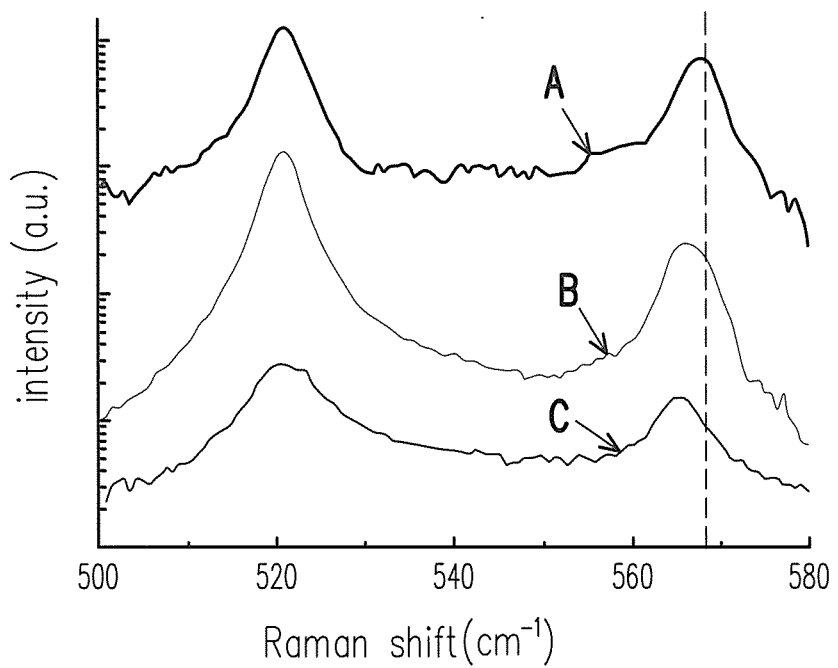
FIG. 3 shows characteristic curves of Raman scattering spectra of the experimental example of the invention and comparative examples.
Figure 4:
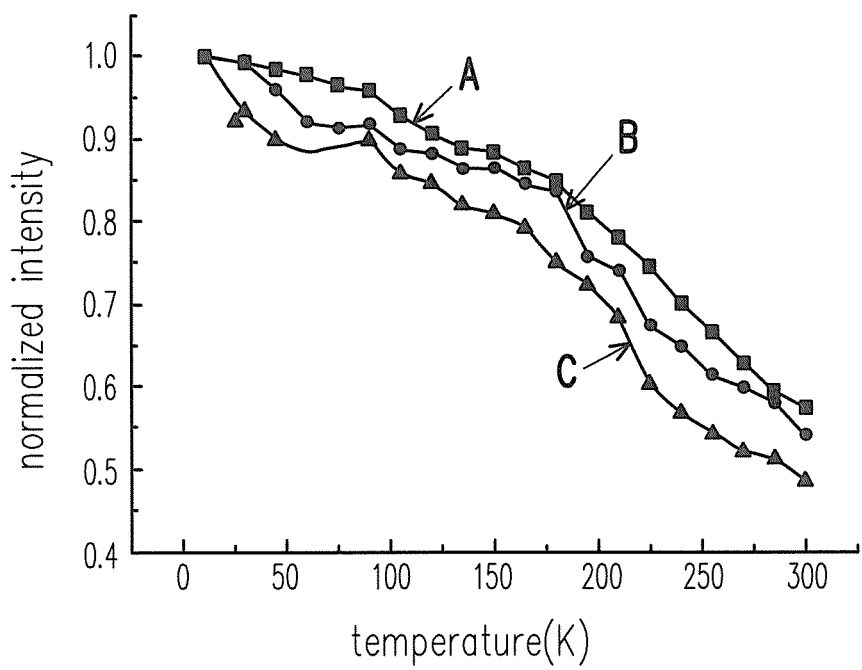
FIG. 4 shows characteristic curves of photoluminescence integrated intensities of the experimental example of the invention and comparative examples varied with temperature.
Figure 5:
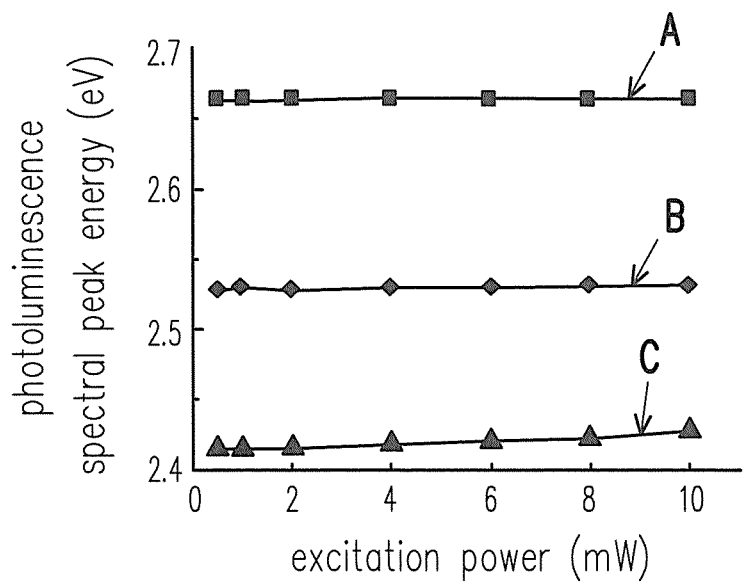
FIG. 5 shows characteristic curves of photoluminescence spectral peak energies of the experimental example of the invention and comparative examples varied with laser excitation power.
Figure 6:
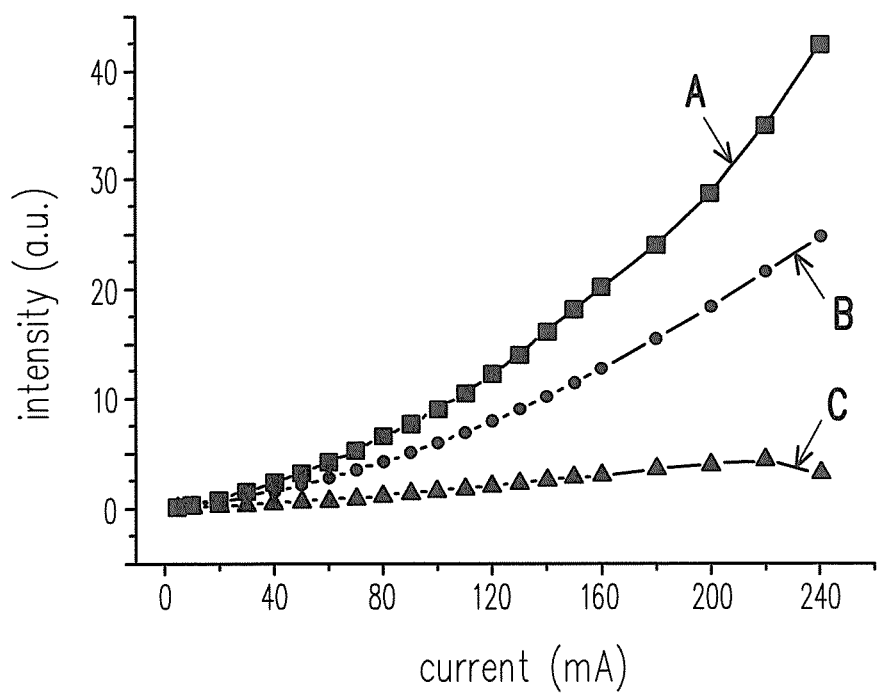
FIG. 6 shows characteristic curves of luminance intensities of the experimental example of the invention and comparative examples varied with an injection current.
Figure 7:
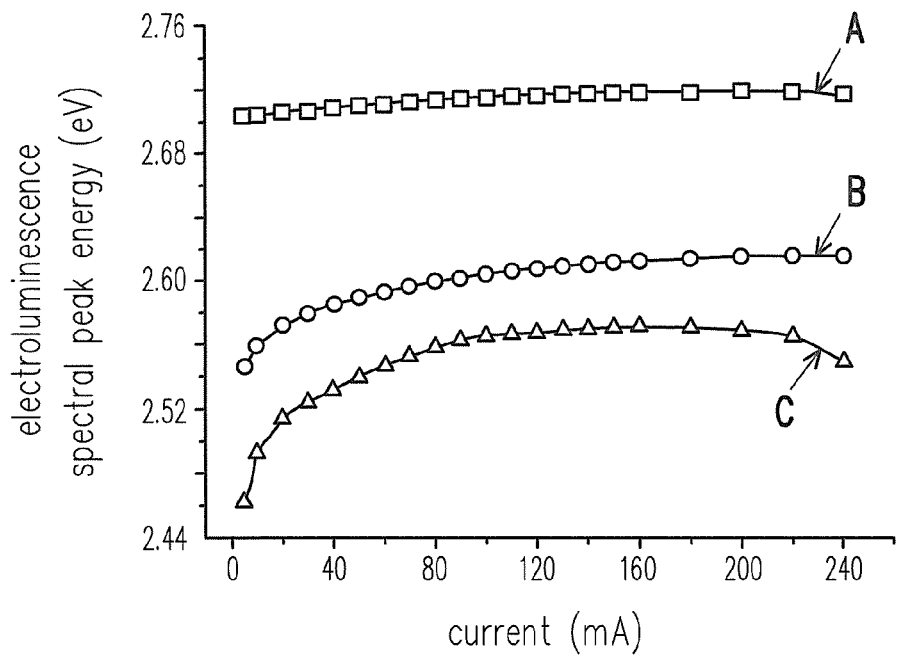
FIG. 7 shows characteristic curves of luminance spectral peak energies of the experimental example of the invention and comparative examples varied with an injection current.
Figure 8:
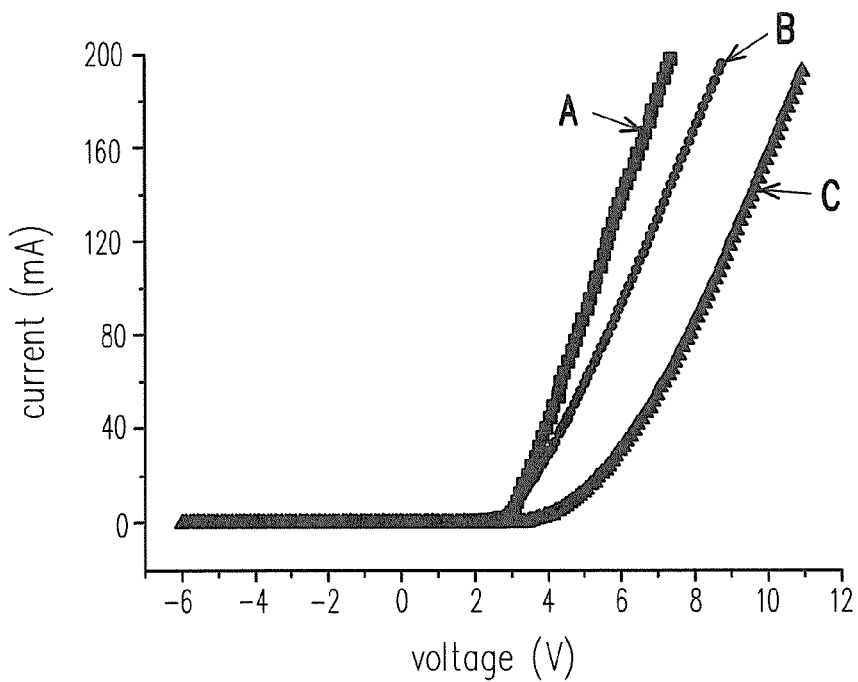
FIG. 8 shows characteristic curves illustrating relations between a current and a voltage of the experimental example of the invention and comparative examples.
Figure 9:
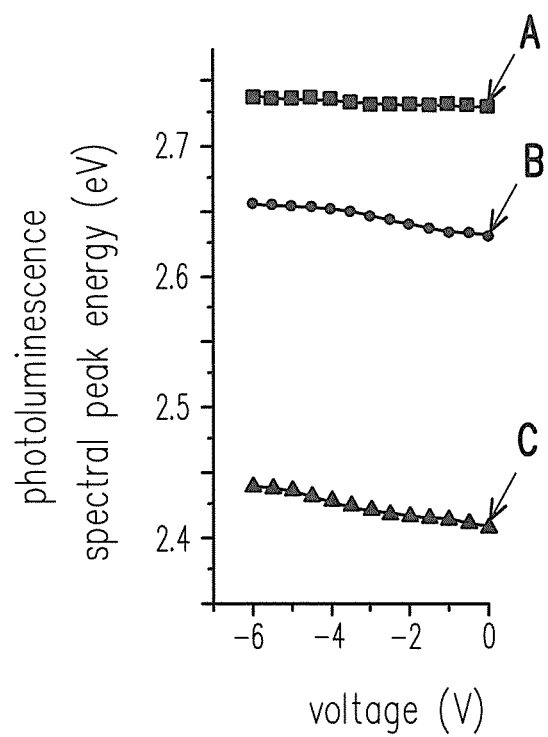
FIG. 9 shows characteristic curves of photoluminescence spectral peak energies of the experimental example of the invention and comparative examples varied with a reverse-biased voltage.

To clearly describe that designing the trenches helps improve the epitaxy quality of the semiconductor layer and characteristics of a light-emitting diode manufactured with the design, further details are described below with reference to Table 1 and FIGS. 2 to 9. FIG. 2 shows surface images of second type doped semiconductor layers of an experimental example of the invention and comparative examples observed with a scanning electronic microscope. FIG. 3 shows characteristic curves of Raman scattering spectra of the experimental example of the invention and comparative examples. FIG. 4 shows characteristic curves of photoluminescence integrated intensities of the experimental example of the invention and comparative examples varied with temperature. FIG. 5 shows characteristic curves of photoluminescence spectral peak energies of the experimental example of the invention and comparative examples varied with laser excitation power. FIG. 6 shows characteristic curves of luminance intensities of the experimental example of the invention and comparative examples varied with an injection current. FIG. 7 shows characteristic curves of luminance spectral peak energies of the experimental example of the invention and comparative examples varied with an injection current. FIG. 8 shows characteristic curves illustrating relations between a current and a voltage of the experimental example of the invention and comparative examples. FIG. 9 shows characteristic curves of photoluminescence spectral peak energies of the experimental example of the invention and comparative examples varied with a reverse-biased voltage. In FIGS. 3-9, a curve A represents the experimental example of the invention having a structure shown in FIG. 1F. A curve B is the first comparative example differing from the experimental example in that a silicon (110) substrate without disposing the trenches is used. A curve C is the second comparative example differing from the experimental example in that a silicon (111) substrate without disposing the trenches is used.

TABLE 1

| Sample | Experimental Example (A) (A) | First Comparative Example (B) | Second Comparative Example (C) |
|---|---|---|---|
| Raman shift (cm$^{-1}$) | 567.8 | 566.2 | 565.4 |
| Internal quantum efficiency (%) | 57.4 | 54.1 | 48.5 |
| Shift of photoluminescence spectral peak energy (meV) | 1.1 | 3.9 | 13.2 |
| Ratio of electroluminescence intensity at 240 (mA) | 1.71 | 1 | 0.13 |
| Shift of electroluminescence spectral peak energy (meV) | 15.8 | 70.3 | 110.4 |
| Device resistance (Ω) | 21.2 | 27.0 | 27.1 |
| Shift of photoluminescence spectral peak energy with reverse bias voltage (meV) | 8 | 25 | 31 |

FIGS. 2(a) to 2(c) are respectively surface images of the second type doped semiconductor layers of the experimental example, the first comparative example, and the second comparative example observed with the scanning electron microscope. As shown in FIG. 2(b), given that the silicon substrate (110) is not disposed with the trenches, a semiconductor epitaxial layer on the silicon substrate (110) is prone to crack, and a direction of the cracks is parallel to the second direction (i.e. the m-axis direction). In addition, as shown in FIG. 2(c), cracks are the most serious when the silicon (111) substrate without disposing with the trenches is used. Compared with the first and second comparative examples, a semiconductor epitaxial layer of the experimental example is crack-free. Namely, the quality of the subsequent epitaxial layer is improved through the disposition and design of the trenches of the silicon (110) substrate of the experimental example.

Referring to FIG. 3, a peak value of the Raman shift of gallium nitride is generally located at 567.6 cm$^{-1}$ under a stress-free condition, as indicated by a dashed line in FIG. 3. However, since gallium nitride and the silicon substrate have different thermal expansion coefficients, there is a tensile stress generated in the gallium nitride due to the dragging of the silicon substrate during the temperature-dropping process after film-forming of the gallium nitride, thereby resulting in a peak value of the Raman shift less than 567.6 cm$^{-1}$. The second row of Table 1 indicates that compared to the first and second comparative examples, the experimental example effectively reduces a remaining stress in epitaxial structure, thereby producing the epitaxial structure with almost stress-free.

In addition, FIG. 4 and the third row of Table 1 indicate that there is a relatively higher internal quantum efficiency in the experimental example. Also, FIG. 5 and the fourth row of Table 1 indicate that there is a smaller shift of spectral peak energy in the experimental example as the laser excitation power varies. More specifically, there is a relatively smaller blue shift in the experimental example as the laser excitation power varies. The blue shift is mainly due to a potential screening effect caused by carrier injection on a quantum-confined Stark effect (QCSE). In other words, compared with the first comparative and second comparative examples, the QCSE in the device of the experimental example is smaller.

Referring to FIG. 6 and the fifth row of Table 1, when the injection current is set at 240 mA, an intensity of the experimental example is 1.7 times of an intensity of the first comparative example, and an intensity of the second comparative example is 0.13 times of the intensity of the first comparative example, given that the intensity of the first comparative example is 1. Thus, it is shown that with disposition and design of the trenches in the experimental example, the semiconductor device has a preferable characteristic (i.e. a higher light-emitting efficiency).

Besides, as shown in FIG. 7 and the sixth row of Table 1, there is a relatively smaller shift of electroluminescence spectral peak energy in the experimental example when the injection current changes. Consequently, it verifies again that the QCSE in the device of the experimental example is smaller.

Referring to FIG. 8 and the seventh row of Table 1, where slopes of curves A, B, and C are respectively reciprocals of resistances of the devices. FIG. 8 shows that with the same voltage applied, the semiconductor device of the experimental example has a relatively higher current and a relatively lower resistance. Namely, the semiconductor device of the experimental example has a preferable characteristic.

In addition, as shown in FIG. 9 and the eighth row of Table 1, with a reverse bias of 0V to −6V applied, the experimental example also shows a relatively smaller shift of photoluminescence spectral peak energy, verifying again that the QCSE in the device of the experimental example is smaller. In other words, with disposition of the trenches, the experimental example is capable of reducing strain distribution to reduce the QCSE, thereby reducing an influence of an internal electric field on the semiconductor light-emitting device, solving the problem of energy band curving, enhancing overlapping of electron and hole wavefunctions, and improving the internal quantum efficiency. Thus, a semiconductor device having a preferable characteristic, such as a light-emitting diode having a preferable light-emitting efficiency, is fabricated.

In view of the foregoing, the substrate of the semiconductor device of the invention uses the silicon (110) substrate and takes advantages of the anisotropic lattice structure and the anisotropic thermal expansion efficient of the silicon substrate (110) to design the trenches. The cracks of the epitaxial layer are reduced by reducing the contact area between the silicon (110) substrate and the gallium nitride layer. In addition, a lateral growth mechanism of the semiconductor layer on the trenches is used to reduce threading dislocations. Also, when the semiconductor device serves as a semiconductor light-emitting device, the light extraction efficiency is improved by disposing of the trenches. Therefore, the semiconductor device of the invention has a preferable characteristic.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A fabrication method of a semiconductor device, comprising:

providing a silicon (110) substrate, wherein a plurality of trenches are formed on the silicon (110) substrate, each of the trenches at least extends along a first direction, the first direction is parallel to a <1-10> crystal direction of the silicon (110) substrate, and only air is in the trenches as a transmitting medium;

forming a buffer layer on the silicon (110) substrate, the buffer layer exposing the trenches;

forming a first type doped semiconductor layer on the buffer layer, the first type doped semiconductor layer covering the trenches;

forming a light-emitting layer on the first type doped semiconductor layer; and forming a second type doped semiconductor layer on the light-emitting layer.

2. The fabrication method of the semiconductor device as claimed in claim 1, wherein the trenches are arranged along a second direction, and the second direction is parallel to a <00-1> crystal direction of the silicon (110) substrate.

3. The fabrication method of the semiconductor device as claimed in claim 2, wherein an arrangement period of the trenches falls within a range between 100 nanometers and 100 micrometers.

4. The fabrication method of the semiconductor device as claimed in claim 1, wherein a width of each of the trenches falls within a range between 50 nanometers and 50 micrometers.

5. The fabrication method of the semiconductor device as claimed in claim 1, wherein a depth of each of the trenches falls within a range between 100 nanometers and 50 micrometers.

6. The fabrication method of the semiconductor device as claimed in claim 1, wherein a film-forming process of the buffer layer comprises a plurality of levels of temperature modulation, and temperatures of the levels includes gradually drop.

7. The fabrication method of the semiconductor device as claimed in claim 6, wherein the temperature at each of the levels ranges between 600° C. to 1200° C.

8. The fabrication method of the semiconductor device as claimed in claim 1, wherein a material of the buffer layer, the first type doped semiconductor layer, the light-emitting layer, and the second type doped semiconductor layer comprises gallium nitride, indium nitride, indium gallium nitride, aluminum nitride, aluminum gallium nitride, indium gallium aluminum nitride, or a combination thereof.

9. The fabrication method of the semiconductor device as claimed in claim 1, further comprising forming a strain compensation stack layer on the buffer layer after the buffer layer is formed and before the first type doped semiconductor layer is formed.

10. The fabrication method of the semiconductor device as claimed in claim 9, wherein the strain compensation stack layer comprises at least one aluminum nitride layer and at least one gallium nitride layer, and the at least one gallium nitride layer is located between the at least one aluminum nitride layer and the buffer layer.

11. A semiconductor device comprising:
a silicon (110) substrate having a plurality of trenches, wherein each of the trenches at least extends along a first direction, the first direction is parallel to a <1-10> crystal direction of the silicon (110) substrate, and only air is in the trenches as a transmitting medium;
a buffer layer, located on the silicon (110) substrate and exposing the trenches;
a first type doped semiconductor layer, located on the buffer layer and covering the trenches;
a light-emitting layer, located on the first type doped semiconductor layer; and
a second type doped semiconductor layer, located on the light-emitting layer.

12. The semiconductor device as claimed in claim 11, wherein the trenches are arranged along a second direction, and the second direction is parallel to a <00-1> crystal direction of the silicon (110) substrate.

13. The semiconductor device as claimed in claim 12, wherein an arrangement period of the trenches falls within a range between 100 nanometers and 100 micrometers.

14. The semiconductor device as claimed in claim 11, wherein a width of each of the trenches falls within a range between 50 nanometers and 50 micrometers.

15. The semiconductor device as claimed in claim 11, wherein a depth of each of the trenches falls within a range between 100 nanometers and 50 micrometers.

16. The semiconductor device as claimed in claim 11, wherein a material of the buffer layer, the first type doped semiconductor layer, the light-emitting layer, and the second type doped semiconductor layer comprises gallium nitride, indium nitride, indium gallium nitride, aluminum nitride, aluminum gallium nitride, indium gallium aluminum nitride, or a combination thereof.

17. The semiconductor device as claimed in claim 11, further comprising a strain compensation stack layer located between the buffer layer and the first type doped semiconductor layer.

18. The semiconductor device as claimed in claim 17, wherein the strain compensation stack layer comprises at least one aluminum nitride layer and at least one gallium nitride layer, and the at least one gallium nitride layer is located between the at least one aluminum nitride layer and the buffer layer.

* * * * *